United States Patent
Chadha et al.

Patent Number: 6,088,445
Date of Patent: Jul. 11, 2000

[54] ADAPTIVE FILTER SYSTEM HAVING MIXED FIXED POINT OR FLOATING POINT AND BLOCK SCALE FLOATING POINT OPERATORS

[75] Inventors: Mandeep Chadha, Austin; Shawn Robert McCaslin, Buda, both of Tex.; John Camagna, Sacramento, Calif.; Nariankadu Datatreya Hemkumar, Austin, Tex.

[73] Assignee: Crystal Semiconductor Corp., Austin, Tex.

[21] Appl. No.: 08/904,898

[22] Filed: Aug. 1, 1997

[51] Int. Cl.[7] .......................... H04M 9/00; G06F 17/10
[52] U.S. Cl. ............................. 379/411; 308/322
[58] Field of Search ............................. 379/411, 410, 379/406, 390, 391, 407, 408; 364/724–19, 724.2, 768, 765; 708/322, 505, 209

[56] References Cited

U.S. PATENT DOCUMENTS

| | | | |
|---|---|---|---|
| 4,592,006 | 5/1986 | Hagiwara et al. | 364/748.11 |
| 5,303,174 | 4/1994 | Okamoto | 364/748.11 |
| 5,323,458 | 6/1994 | Park et al. | 379/390 |
| 5,526,426 | 6/1996 | McLaughlin | 379/411 |
| 5,638,311 | 6/1997 | Fujii et al. | 364/724.19 |
| 5,751,902 | 5/1998 | Hofman | 364/724.19 |
| 5,790,440 | 8/1998 | Fujii et al. | 364/724.19 |

*Primary Examiner*—Forester W. Isen
*Assistant Examiner*—Jacques Saint-Surin
*Attorney, Agent, or Firm*—Gregory M. Howison

[57] ABSTRACT

An adaptive filter is provided which has fixed point or floating point data stored in a data RAM (74) and block scale floating point coefficients stored in a coefficient RAM (84). The data and coefficients are utilized in a filter algorithm which utilizes a multiplier and an accumulator to provide a convolution result. Coefficients are updated by adding the multiplied result of the data RAM value and the error value to the old value of the coefficient. This is done for all the coefficient values in the coefficient RAM. The error value indicates the difference between the filter output and the sampled near-end signal that is the echo. These new coefficients are examined and if any have a value above or all have a value below a predetermined threshold, then the mantissas of all the coefficients are shifted and the exponent adjusted in the next filter cycle.

31 Claims, 5 Drawing Sheets

ADAPTIVE FILTER SYSTEM HAVING MIXED FIXED POINT OR FLOATING POINT AND BLOCK SCALE FLOATING POINT OPERATORS

TECHNICAL FIELD OF THE INVENTION

The present invention pertains to adaptive filters and more particularly, to the method by which data and coefficients are stored in the adaptive filter.

BACKGROUND OF THE INVENTION

An adaptive filter utilized in a typical speakerphone system is operable to estimate the characteristics of the echo path and generate a simulated echo signal from the digitized far-end user's signal. It includes a subtractor that subtracts the simulated echo signal from the near-end echo signal and generates a residual signal or error. The adaptive filter is operable to bring the simulated echo signal as close to the actual echo signal as possible so as to force the residual signal to converge as close as possible to zero.

Most adaptive filters utilize an impulse response type of filter which requires data and coefficients to be stored in memory and a plurality of multiplications and additions to be performed on data and associated coefficients. The precision of the filter depends upon the length and format of the digital word that is utilized to represent the data and the coefficients. A fixed point representation gives the maximum precision at the cost of additional hardware while a floating point representation sacrifices accuracy to get a bigger range of possible values. Block scale floating point representation uses a single exponent value that scales all the mantissas by the same amount. The value of the exponent depends on the size of the largest number that is stored in the memory at any given time. In an application that uses a speech signal, the block scale floating point representation is not appropriate for storing data since large variations in the magnitude of the input signal over short periods of time would cause the exponent to become large and scale down the small values stored in the memory to a considerable extent. This would result in a significant loss in precision of the data stored in the memory. The floating point representation is most appropriate for this application as it allows maximum precision for small numbers and truncates the least significant bits from the large numbers.

SUMMARY OF THE INVENTION

The present invention disclosed and claimed herein comprises an adaptive filter. The adaptive filter includes a data memory for storing data in a fixed point or floating point format and a coefficient memory for storing coefficient mantissas in a block scale floating point format with an associated register for storing a common exponent for all the coefficient mantissas. A digital filter engine is operable to receive input data for storage in the data memory and process the stored data and coefficients to produce a digital filter output. The filter engine is a finite impulse response filter engine for effecting a finite impulse response filter algorithm. A coefficient update device is operable to update the mantissa values stored in the coefficient memory in accordance with a predetermined algorithm. A coefficient check device is then operable to determine the largest value stored in the coefficient memory and determine the exponent and mantissa correction required for the coefficients in the next filter cycle. If any one mantissa value is larger than a threshold and the coefficient exponent is smaller than the maximum value allowed, then all the coefficient mantissas are arithmetically shifted right by one bit in the next filter cycle and the exponent is incremented by one. If all the coefficient mantissa values are smaller than a threshold and the exponent is greater than zero, then the mantissas are arithmetically shifted left by one bit in the next filter cycle and the exponent is decremented by one.

In another aspect of the present invention, the data memory is operable to store data in a floating point format with both a mantissa and an exponent associated with each data word stored.

DETAILED DESCRIPTION OF THE INVENTION

Figure 1:
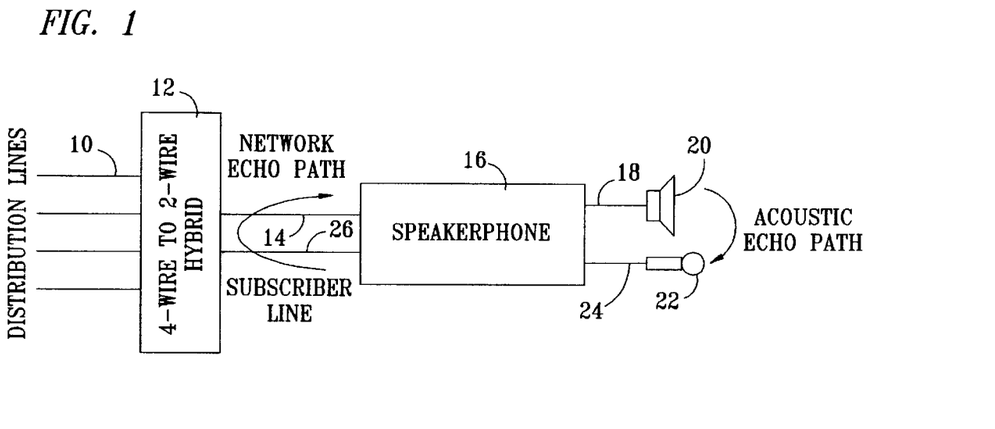
FIG. 1 illustrates an overall block diagram of a speakerphone system operating in accordance with the present invention.

Referring now to FIG. 1, there is illustrated a speakerphone system that incorporates an adaptive filter (not shown) operating in accordance with the present invention. A four wire system includes distribution lines 10 that are interfaced with a four-wire to two-wire hybrid circuit 12 on one side thereof The other side of the hybrid 12 is interfaced to a speakerphone 16 through a two wire subscriber line 24. The incoming or inbound signal to the speakerphone 16 drives a speaker 20 through a line 18. Adjacent the speaker 20 is a microphone 22 which is attached to the speakerphone 16 with a line 24. Outgoing signals from the speakerphone 16 are input to the hybrid 12 through line 26.

In operation, an acoustic echo path is generated from the speaker 20 to microphone 22. A network echo path 14 exists from the subscriber line 26 from the output to the input. A simple way to prevent the acoustic echo path is to turn off the microphone to prevent the reflective signal from traveling back to the far-end user, who will eventually hear this as an echo. With respect to the network echo path, this is due to the fact that the hybrid coil incorporated in the hybrid 12 does not match perfectly with the subscriber line 16 itself As a result, the hybrid coil not only passes the signal received from the far-end user via four-wire line 10 to the near-end user via the subscriber line 26, but also allows the signal from the near-end user to leak over to the input.

Figure 2:
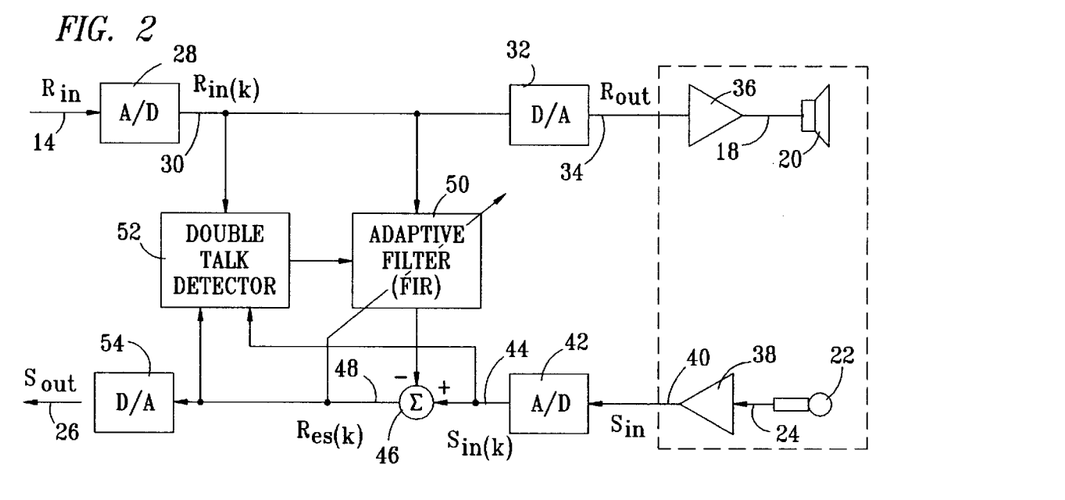
FIG. 2 illustrates a detailed block diagram of a double talk detector that utilizes an adaptive filter.

Referring now to FIG. 2, there is illustrated a block diagram of a double talk detector utilizing the adaptive filter from the present invention from a general overview. The operation of the double talk detector is described in U.S. patent application Ser. No. 08/536,986, filed Sep. 29, 1995 and titled "DOUBLE-TALK DETECTOR FOR ECHO CANCELLER", which is incorporated herein by reference. The far-end audio is received from a far-end source through a receive line 14 which is input to an A/D converter 28 to provide on the output thereof a sampled receive value $R_{in}(k)$ on a line 30. This is input to a D/A converter 32 to convert the digital value back to an analog value $R_{out}$ on line 34. This is input to a near-end device 20. The near-end device is comprised of a receive path wherein the line 34 is input through a buffer 36, the output of which is available on line 18 and drives a speaker 20. A transmit path is provided via a microphone 22, the output of which is available on line 24 and connects to a buffer/driver 38, which drives an output line 40 to provide an output signal $S_{in}$.

The transmit path on the output $S_{in}$ is input to an A/D converter 42, which provides a sampled digital output $S_{in}(k)$ on a line 44. This is input to the positive input of a subtraction circuit 46. An adaptive filter 50 is provided, which has the input thereof connected to $R_{in}(k)$ on line 30 and provides on the output thereof a filtered output signal which is input to the negative input of the subtraction circuit 46. This provides the difference of the sampled signal $S_{in}(k)$ on line 44 and the signal output by the adaptive filter 50. This is output on a line 48 as a residual signal Res(k), this being a sampled signal. This line 48 and the signal Res(k) are input to a D/A converter 54 to provide the output signal to the far end.

The adaptive filter 50 is operable to provide the basic echo canceling operation. As illustrated in FIG. 1, there is an echo path between the speaker 20 and microphone 22. As such, a portion of the $R_{in}$ signal will be received and fed back to the transmit path resulting in a portion of the $R_{in}$ signal being impressed upon $S_{out}$. The adaptive filter 50 is operable to develop and periodically update an adjusted estimated impulse response of the near-end path and generate, in accordance with the estimated impulse response and a received path signal, an estimate of the echo signal occurring on the transmit-in path in response to the receive path signal. This echo estimate signal is algebraically combined with the transmit-in signal $S_{in}(k)$ with the subtraction circuit 46 to yield the transmit-out path signal Res(k) on line 48. The adaptive filter also receives as an input the Res(k) signal for use in the adaptive operation.

In normal operation with the echo path stationary, the echo canceller will estimate the reflection signal, the quality of this estimation determining the degree of echo reduction. The measure of the quality of the estimate is referred to as the echo return-loss enhancement (ERLE). This is defined as the reduction in echo power provided by the echo canceller; equivalently, it is the ratio of the estimated power in the signal at the output of the echo canceller to the estimated echo power, as follows $$ERLE = 10 \log \frac{E[S_e^{2\epsilon}]}{E[Res^2]}$$

wherein E=Expectation operator

This echo reduction is also important for reducing loop gain. The far end and the near end are linked by an acoustic loop. If the loop gain in this loop is too high, the loop will become unstable and will produce acoustic howling. If the system at the far end is a full-duplex speakerphone, that speakerphone will be able to operate with higher output and input gain, if it can rely on loop-gain reduction from the near-end echo canceller.

The echo canceller produces the estimate by filtering the signal from the far end with the adaptive filter 50, which is operable to effectively model the echo path and provide a prediction of the echo signal. In modern echo cancellers, this filter is trained by the LMS (Least-Mean Squared) algorithm. In such systems, the signal from the far end, i.e., the "training signal" is used to "illuminate" the echo path; that is, the LMS algorithm can estimate the path response by observing the path's effect on the far-end signal, once it has been received at the near-end microphone 22.

Figure 3:
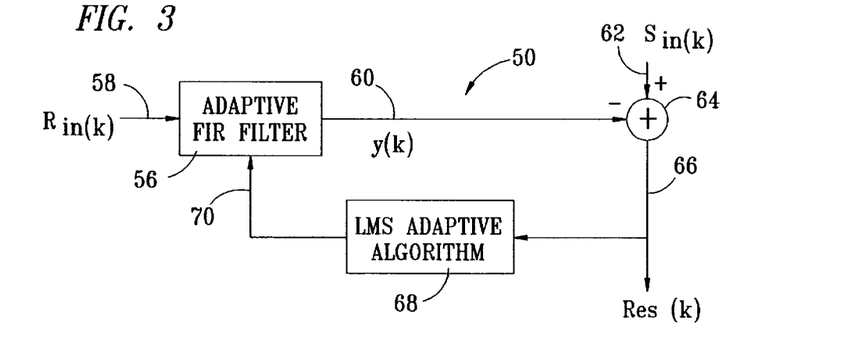
FIG. 3 illustrates a high level block diagram of the adaptive filter.

Referring now to FIG. 3, there is illustrated a block diagram of the adaptive filter 50. In the filter 50, a sampled input sequence $R_{in}(k)$ of the far-end signal is provided to an adaptive FIR filter section 56 which performs the convolution of the sampled input sequence to produce the filter output y(k). Thereafter, an error term Res(k) is determined by calculating the difference between the filter output y(k) and a sampled near-end signal $S_{in}(k)$ by the subtraction circuit 64. The error term Res(k) is then applied to a least mean square (LMS) adaptive algorithm block 68 for computing updated weighting coefficients to be used by the adaptive FIR filter 56. In the filter of the present invention, which utilizes a FIR filter with N taps, a least mean square (LMS) estimation technique is used for the weight update computation. Specifically, for a sampled input sequence $R_{in}(k)$, the system computes the output $$y(k) = \sum_{n=0}^{N-1} R_\epsilon(k-n) w_n(k)$$

and thereafter, the weights $w_n(k)$ are also updated using the LMS algorithm. Preferably, the system uses an N-stage adaptive filter with adjustable weight $w_n(k)$ for tap n at the kth sampling instant and "n" parallel processing elements which each compute the weight update of each tap according to the LMS algorithm.

Ideally, the filter output y(k) will be equal to the reference $S_{in}(k)$, otherwise an error signal is formed:

$$Res(k) = S_\epsilon(k) - y(k) = S_\epsilon(k) - \sum_n R_\epsilon(k-n) w_n(k)$$

Thereafter, the error power is minimized according to the LMS algorithm or some iterative algorithm.

Figure 4:
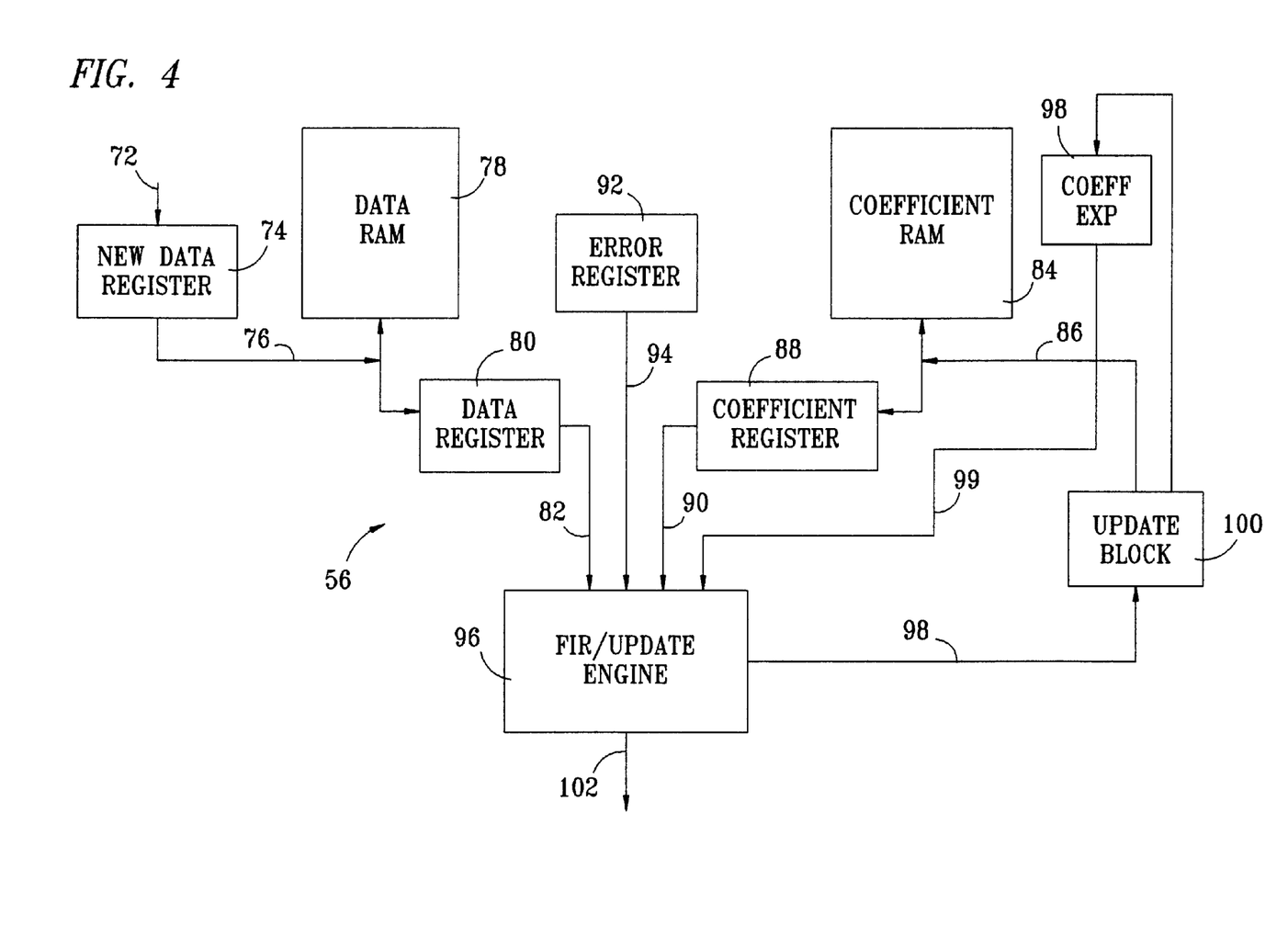
FIG. 4 illustrates a general block diagram of the architecture of the adaptive filter of the present invention.

Referring now to FIG. 4, there is illustrated a block diagram of the adaptive filter 56 illustrating the arithmetic engine and storage devices. The data is received on an input bus 72, which is input to a new data register 74. This new data register is interfaced with a bus 76. The bus 76 allows data to be transferred to and retrieved from a data RAM 78 using the new data register 74 and a data register 80 interfaced with bus 76. The data RAM 78 is utilized to store the data in a fixed point or floating point format. In the floating point format, the data is comprised of a signed mantissa ($M_b$) and an unsigned exponent ($E_b$). Coefficients for the FIR filter are stored in a coefficient RAM 84 which is interfaced with the bus 86 for reading of data therefrom into the coefficient register 88 and writing of data thereto from the update block 100. The data in the coefficient RAM 84 are block scale floating point values which have associated therewith a single unsigned exponent. However, the exponent is not stored in the coefficient RAM 84; rather, only the mantissas ($M_c$) are stored in the coefficient RAM 84. As will be described hereinbelow, the exponent value is variable, depending upon the coefficient data stored in the coefficient RAM 84. The coefficient exponent has a range of between "0" to $E_{c,max}$, where $E_{c,max}$, depends upon the choice of coefficient range and number of significant bits to be stored as mantissa in the RAM 84. As an example, for a 24-bit coefficient range, if 16 significant bits are stored in the RAM 84, then $E_{c,max}$, is equal to "8".

In addition to the data and filter coefficients, there is also required for a coefficient update operation in the adaptive algorithm in block 68 of FIG. 3 an error component which is stored in an error register 92. This is interfaced with the bus 94.

In order to perform the convolution and also to update the coefficients, a FIR/update engine 96 is provided which is operable to extract appropriate data from RAMs 78 and 84 through data register 80 and coefficient register 88 respectively and take these values and the value stored in the error register 92 to perform either the convolution operation to generate a filter output on a line 102 or generate updated coefficient values with an update block 100. The update block 100, as will be described in more detail hereinbelow, generates the updated mantissa values, Mc, and an exponent value Ec. The coefficient exponent, $E_c$, is stored in a block 98 which is utilized by the FIR/Update engine 96 during processing. Since the exponent $E_c$ is a single value for all mantissa values, $M_v$, stored in coefficient RAM 84, less memory is required, as component to a system that stores the exponent for each mantissa.

However, it should be noted that mantissa values, $M_c$, for different exponents, $E_c$, can be stored in coefficient RAM 84. For example, one half of the mantissas, $M_c$, could have a first exponent, $E_{c1}$, and the remaining mantissas, $M_{c2}$, could have a second exponent, $E_{c2}$, associated therewith. This will be described hereinbelow in more detail.

In an application such as echo cancellation, the coefficient update can be controlled in such a way that the coefficients do not change by significant amounts in consecutive cycles. Also, the nature of the coefficients is such that the large coefficients correspond to the delays due to the echo paths and they are of the most interest, while the remaining coefficients do not carry much useful information. This makes the coefficients ideally suited for a block scale floating point representation. This results in considerable savings in storage space required to hold all the coefficients as the memory needs to store only the mantissa while one register can be used to store the common exponent. This will also be described in more detail hereinbelow.

Figure 5:
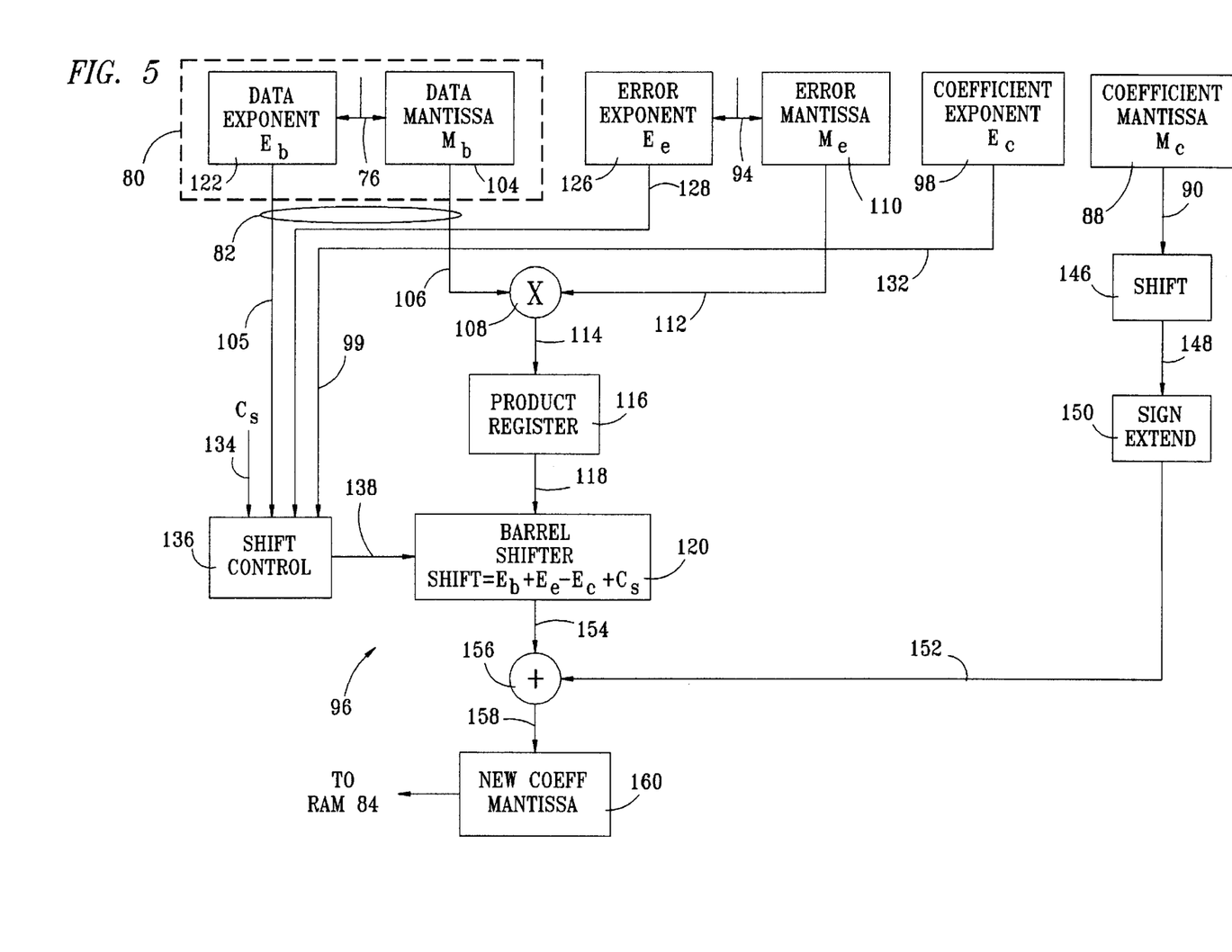
FIG. 5 illustrates a block diagram of the architecture illustrating the data flow for the coefficient update calculation.

Referring now to FIG. 5, there is illustrated a diagrammatic view of the data flow for the coefficient update operation in the FIR/Update engine 96. The error mantissa, $M_e$, is retrieved from a memory area 110, which is essentially the error register 92, and placed on the bus 94. At the same time, the data mantissa, $M_b$, is retrieved from the data memory 78 and is placed onto a bus 106 through a data mantissa register 104. The error mantissa, $M_e$, is multiplied by the data mantissa, $M_b$, with a multiplier 108 to provide a product on a bus 114. This intermediate product value is stored in a product register 116. The output of the product register 116 is input to a barrel shifter 120 which is controlled by a shift control block 136. The shift 25 control block 136 receives the data exponent, $E_b$, and the error exponent, $E_c$, and the negative of the coefficient exponent, $E_c$, and the coefficient shift, $C_s$. The barrel shifter 120 is then operable to provide a shift equal to the sum of the data exponent, $E_b$, and the error exponent, $E_e$, and the negative of the coefficient exponent$_x$ E, and the coefficient shift, $C_s$, the coefficient shift value being the amount of shift determined by the coefficient check device, as is described hereinbelow, during the coefficient update operation of the last sample time. The output of the barrel shifter 120 is then placed on a bus 154 to an accumulator 158. The accumulator 158 is operable to add the output of the barrel shifter 120 with the value on the bus 152. The value on the bus 152 is derived by inputting the old coefficient mantissa, $M_c$, from register 88 to a shift block 146 through bus 90. The shift block 146 is operable to shift the mantissa by a value of "+1" or "−1". This shift amount, which is either a left shift or a right shift, is the coefficient shift value that has been described hereinabove. The shifted value is output on the bus 148 which is then input to the sign extend block 150, which is operable to extend the sign bit to provide a value of the required word length on the bus 152. The value on the bus 152 is added to the update term, which is the output of the barrel shifter 120 for storage in an intermediate register 160. Thereafter, the new coefficient mantissa is updated into the coefficient memory 84, where it overwrites the old coefficient mantissa value.

After all the coefficient mantissas in the RAM 84 have been updated, the value of the coefficient exponent, $E_c$, is incremented by one if $C_s$ has a value equal to "+1", that is, all the coefficient values were shifted right during the update cycle. If $C_s$ has a value equal to "−1", that is, all the coefficient values were shifted left during the update cycle, then the value of the coefficient exponent, $E_c$, is decremented by one.

The maximum shift that can be performed by the barrel shifter 120 is the maximum value of the data exponent, $E_b$, added with the maximum value of the error exponent, $E_e$, from which the minimum value of the coefficient exponent, E, is subtracted and then the maximum value of the coefficient shift, $C_s$ equal to "+1", is added thereto. The minimum shift will be the minimum value of the data exponent, $E_b$, added to the minimum value of the error exponent, $E_e$, from which the maximum value of the coefficient exponent value, $E_c$, is subtracted and the minimum value of the coefficient shift, $C_s$ equal to "−1", is added. Based on these values, the barrel shifter 120 should be able to handle shift ranges from $(E_{b,min}+E_{e,min}-E_{c,max}+C_{s,min})$ to $(E_{b,max}+E_{e,max}-E_{c,min}+C_{s,max})$.

Figure 6:
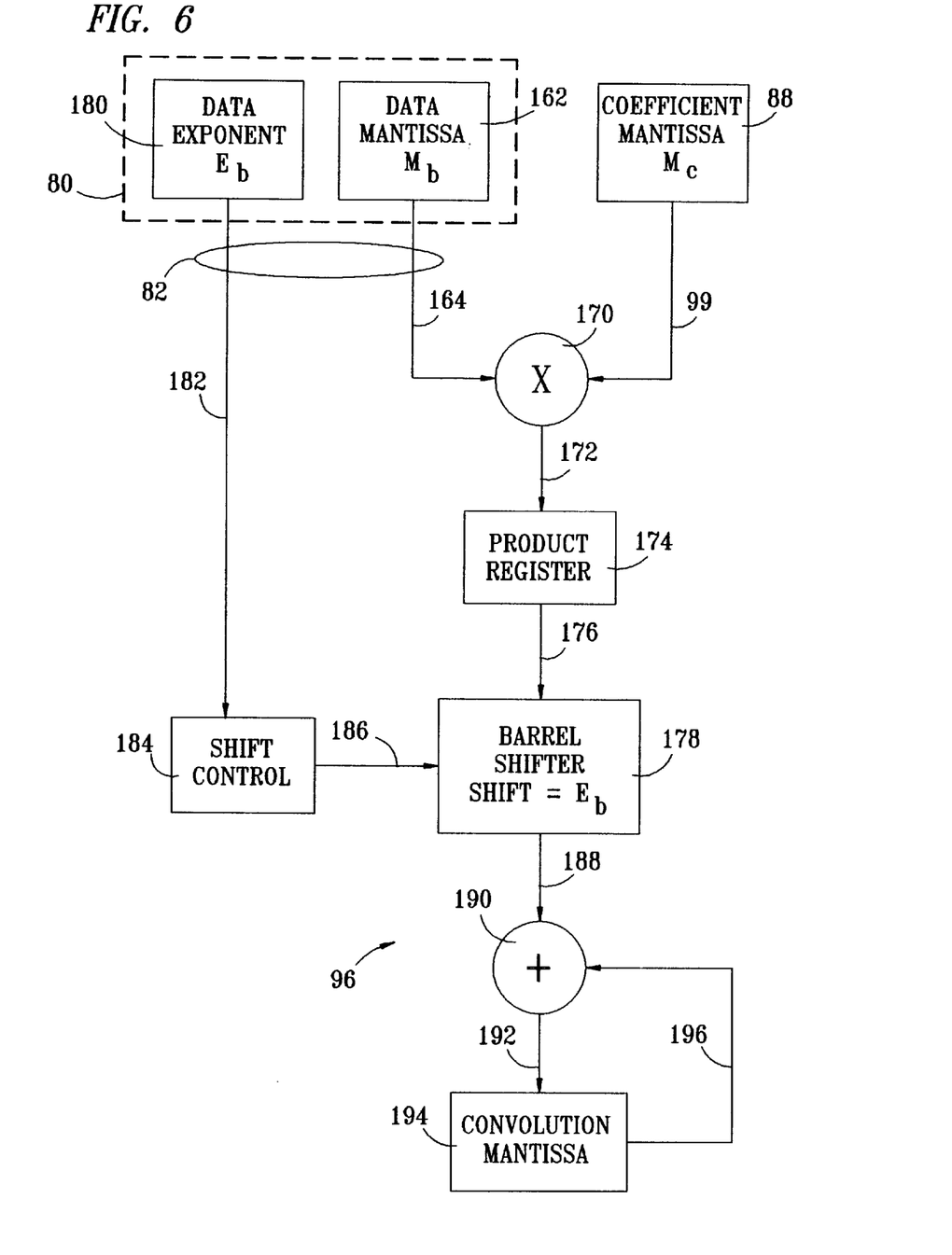
FIG. 6 illustrates a block diagram of the architecture associated with the data flow during the convolution calculation.

Referring now to FIG. 6, there is illustrated a block diagram of the convolution operation. As noted above, the data in the data RAM 78 is comprised of a signed mantissa, $M_b$, and an unsigned exponent, $E_b$. The mantissas, $M_b$, of the data are read in a sequential manner from the data RAM 78 and stored in a register 162. This mantissa is output on a bus 164 to a multiplier 170. The coefficient mantissas, $M_c$, are stored in the coefficient RAM 84. They are also read in a sequential manner from the coefficient RAM 84 and stored in the register 88. The output of this register is placed on the bus 99 for input to the multiplier 170.

The product output of the multiplier 170 for the data mantissa, $M_b$, and the coefficient mantissa, $M_c$, provides a value on an intermediate bus 172 which is then input to a product register 174. The output of this product register is input to a barrel shifter circuit 178. The data exponents, $E_b$, are read in a sequential manner and stored in a register 180. The output of this register is placed on a bus 182 and is input to a shift control block 184. The shift control block 184 calculates the shift amount for input to the barrel shifter from the data mantissa value and outputs the result on a bus 186. This value is input to the barrel shifter 178, which shifts the input value on the bus 178 by the amount calculated by the shift control block and provides a shifted output value on the bus 188. The output of the barrel shifter 178 is input to an adder 190. The adder 190 accumulates the shifted output values on bus 188 for all taps of the filter. This is achieved by sequentially reading all locations in the data RAM 78 and the corresponding weighted coefficient values from the coefficient RAM 84 and repeating the above described procedure for all the taps. After processing all the taps in the FIR filter, the adder 178 produces a convolution mantissa result on a bus 192, which is stored in a register 194. The register 194 is also used to store the intermediate convolution values while the accumulation operation is being performed. The output of the register 194 is connected to the adder 190 through the bus 196. The exponent of the convolution result is the same as the block scale exponent of the coefficient RAM 84.

Figure 7:
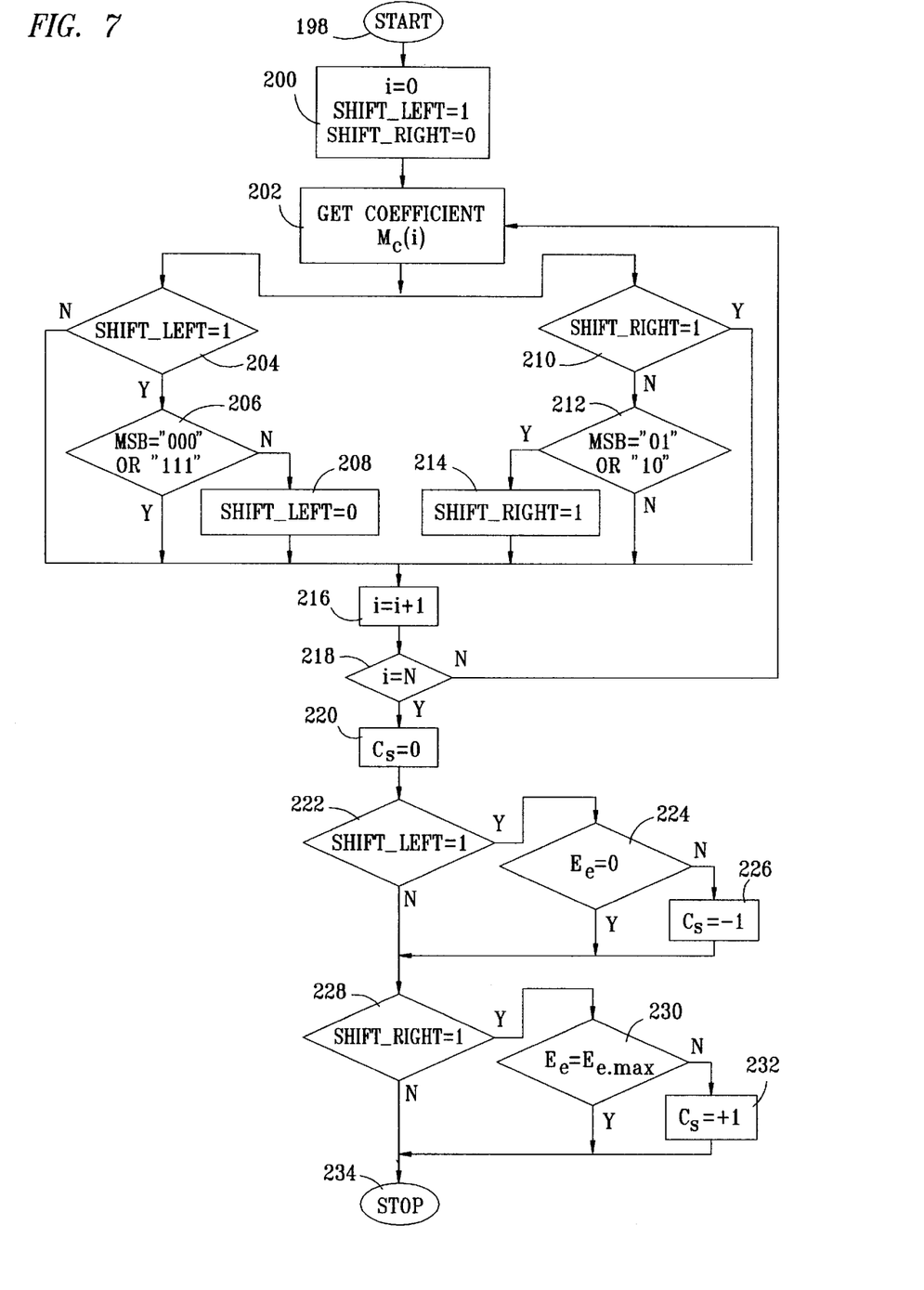
FIG. 7 illustrates a flowchart for the coefficient check operation.

Referring now to FIG. 7, there is illustrated a flowchart for the coefficient check operation. The flowchart is initiated at block 198 when a new value of $R_{in}(k)$ is generated and then flows to a function block 200. In this block, the index I, that provides the address to the location of the coefficient RAM 84 being read, is initialized to zero. Two more variables, shift_left and shift_right, are also initialized to 1 and 0 respectively. From function block 200, the control flows to a loop that is entered at a function block 202. The loop begins with fetching the updated coefficient value corresponding to the address that is pointed to by the index I, and which was updated into the coefficient RAM 84 by the coefficient update block that has been illustrated in FIG. 5. The flow splits into two branches after the updated coefficient value has been read. In the first branch, the control flows to a decision block 204 where the variable shift_left is tested for a value of "1". If the shift_left variable has a value of "0", then the control flows along the "N" path to a function block 216. However, if the shift_left variable has a value of "1", then the control flows along the "Y" path to a decision block 206, where the most significant bits (MSB) of the exponent are checked. If the MSBs are "111" for a negative number or "000" for a positive number, then the value of the shift_left variable is not changed and the control flows along the "Y" path directly to function block 216. However, if the MSBs are not equal to "111" or "000", then it is determined that the mantissa value is large and the coefficient values should not be shifted left in the next sample time. In this case, the control flows along the "N" path to a function block 208 where the shift_left variable is assigned a value equal to "0". If all the coefficient mantissas in the coefficient RAM 84 have the MSBs equal to "000" or "111", then the shift_left variable will have a value equal to zero when the control exits the loop. From function block 208, the control flows to the function block 216.

In the other branch of the control flow, the decision block 210 checks the value of the variable shift_right and if it is zero, then the rest of the branch processing is bypassed and the control flows directly along the "Y" path to the function block 216. However, if the shift_right variable does not have a value equal to zero, then the control flows along the "N" path and the MSBs of the coefficient are tested to be equal to "10" for negative numbers or "01" for positive numbers by the decision block 212. If the MSBs meet the aforementioned criteria, then the coefficient is determined to have a large value and all the coefficients in the RAM should be shifted left in the next sample time. Under this condition, the control flows along the "Y" path to the function block 214 where the shift_right variable is set to a value of "1". However, if the MSBs are not equal to "01" or "10", then the control flows along the "N" path directly to function block 216.

The index I, that is used to provide the address for the RAM 84, is incremented by one in the function block 216 of the control flow. This sets the address of the RAM 84 to the next location. From function block 216, control flows to the decision block 218 where the value of the index I is checked to see if it is equal to the number of taps in the filter. If the two values are equal, then all the coefficients in the coefficient RAM 84 have been processed and the control flows along the "Y" path to function block 220. However, if all the coefficients in the RAM have not been processed, then the control flows along the "N" path back to the start of the loop at function block 202.

After all the coefficients in the RAM have been processed, control flow exits the loop and flows to the function block 220 where the variable Cs is initialized to value equal to "0". In the next step, the shift_left variable is checked to see if it's value is equal to "1" in the decision block 222. If the value of shift_left is equal to "1", then all the coefficient mantissas stored in the RAM 84 are small and should be shifted left by one in the next update cycle to maximize precision and control flows along the "Y" path to the decision block 224. However, if the value of the coefficient exponent is equal to "0", then the coefficient RAM 84 is storing the full precision of all the coefficients and the values in RAM 84 should not be shifted left in the next update cycle. Under this condition, control flows along the "N" path directly to a decision block 228. In decision block 224, if the coefficient exponent is determined to have a value equal to zero, then the control flows along the "Y" path to decision block 228. However, if the coefficient exponent is determined to have a value not equal to zero, then the control flows along the "N" path to a function block 226 where the value of Cs is set equal to "−1". This will make all the coefficient mantissas in the RAM 84 be shifted left by one in the next coefficient update cycle.

In decision block 228, the shift_right variable is checked to see if its value is equal to "1". The variable shift_right is set to a value equal to "1" if any one coefficient mantissa is found to have MSBs equal to "01" or "10". In this case, the coefficient mantissa values have become large and there is possibility of overflow in the next update cycle. To avoid an overflow, all the coefficients in the RAM 84 should be shifted right in the next update cycle. If the value of shift_right is not equal to "1", then the control flows along the "N" path to a function block 234. However, if the value of shift_right is equal to "1", then the control flows along the "Y" path to a decision block 230. In decision block 230, the coefficient exponent value is checked to see if it is equal to the maximum allowed value, Ec,max. If it is, then the control flows along the "Y" path to function block 234, else, it flows along the "N" path to a function block 232, where the value of Cs is set to "+1". This will make all the coefficient mantissas in the RAM 84 be shifted right by one in the next coefficient update cycle. The coefficient check operation control flow stops at a function block 234.

All of the above described preferred embodiment utilizes only a single coefficient exponent to define the exponent for all of the mantissas for the coefficients. Typically, coefficients have values that range for a given filter application from a minimum to a maximum. This maximum typically occurs in the mid-coefficient range. Therefore, the coefficients will run from a minimum to a maximum back to a minimum. As such, the minimum values for the coefficients on the extreme ends of the filter can be accounted for by having two exponent coefficients, one for different areas of the coefficient RAM. For example, the upper third and lower third of the RAM may have one exponent associated with those coefficients and the middle section of the coefficient RAM may have a second exponent. This allows a different resolution for the coefficients while only requiring one exponent for each resolution step. Therefore, there can be multiple fixed blocks having a single exponent associated therewith such that, during the processing, it is only necessary to have knowledge of this exponent in order to process the information for that given block. As a block boundary is passed, it is then only necessary to utilize a different exponent when extracting the mantissa. It is only important that the block size be fixed independent of the change in a given mantissa value, although a block boundary between two adjacent blocks may be determined as a function of relative values in different blocks. The primary aspect noted in this embodiment would be that there are only a limited number of exponents as compared to the mantissas, such that significant less storage area is required as compared to a system that would store both the mantissa and coefficient for each value.

In summary, there has been provided an adaptive filter that uses a combination of fixed point or floating point data and block scale floating point coefficients. These coefficients are variable such that the filter response is varied as a function of an error value that is determined by taking the difference of the filter output and the sampled near-end signal. This error value is minimized by varying the coefficients and then storing updated coefficients in a coefficient memory. The coefficients are stored in a block scale floating point format with the mantissas being stored in a memory and the common exponent being stored in a register. As the coefficient values increase, a fixed number of the most significant bits of the coefficient are stored in memory and the exponent is incremented. As the coefficient values decrease, more of the least significant bits are stored in the memory and the exponent is decremented. The common exponent scales all the values in the coefficient memory by the same amount.

Although the preferred embodiment has been described in detail, it should be understood that various changes, substitutions and alterations can be made therein without departing from the spirit and scope of the invention as defined by the appended claims.

What is claimed is:

1. An adaptive filter, comprising:
   a data memory for storing data;
   a coefficient memory for storing filter coefficient mantissas in a block scale floating point format with a defined coefficient exponent value;
   a digital filter engine for receiving input data for storage in said data memory and processing said stored data and said stored coefficient mantissas to provide a digital filter output value;
   a coefficient update device for varying said coefficient mantissa values stored in said data memory in accordance with a predetermined algorithm to provide updated coefficient mantissas for storage in said coefficient memory in a given update cycle; and
   an exponent device for varying the exponent of the filter coefficient for a mantissa to maximize the range of values that can be stored as a mantissa.

2. The adaptive filter of claim 1, wherein said data memory is operable to store data in a floating point format with both a mantissa and exponent associated with each data word stored.

3. The adaptive filter of claim 1, wherein said digital filter engine comprises a finite impulse response engine.

4. The adaptive filter of claim 1, wherein said coefficient update device varies said coefficient values stored in said coefficient memory to minimize an error value that is determined to exist between the output of said FIR filter engine and a desired output.

5. An adaptive filter, comprising:
   a data memory for storing data;
   a coefficient memory for storing filter coefficient mantissas in a block scale floating point format with a defined coefficient exponent value;
   a digital filter engine for receiving input data for storage in said data memory and processing said stored data and said stored coefficient mantissas to provide a digital filter output value;
   a coefficient update device for varying said coefficient mantissa values stored in said data memory in accordance with a predetermined algorithm to provide updated coefficient mantissas for storage in said coefficient memory; and
   an exponent device for varying the exponent of the filter coefficient for a mantissa to maximize the range of values that can be stored as a mantissa, said exponent device including:
      a comparison circuit for comparing the largest coefficient mantissa to a desired threshold value for each of the coefficient mantissas stored in said coefficient memory;
      a right shift circuit for shifting right by a predetermined number of bits the coefficient mantissa having the largest value when the value thereof exceeds the desired threshold and incrementing the exponent by the predetermined number of bits; and
      a left shift circuit for shifting left by a predetermined number of bits the coefficient mantissa having the largest value when the value thereof is less than the desired threshold and decrementing the exponent by the predetermined number of bits.

6. An adaptive filter comprising:
   a data memory for storing data;
   a coefficient memory having at least two sections for storing filter coefficient mantissas in a block scale floating point format with a defined coefficient exponent value associated with each of said at least two sections and the mantissas stored therein;
   a digital filter engine for receiving input data for storage in said data memory and processing said stored data and said stored coefficient mantissas to provide a digital filter output value;
   a coefficient update device for varying said coefficient mantissa values stored in said data memory in accordance with a predetermined algorithm to provide updated coefficient mantissas for storage in said coefficient memory in a given update cycle; and
   an exponent device for varying the exponent of the filter coefficient for a given length mantissa in a subsequent update cycle in each of said at least two sections to maximize the range of values that can be stored as a mantissa in said at least two sections.

7. The adaptive filter of claim 6, wherein said data memory is operable to store data in a floating point format with both a mantissa and exponent associated with each data word stored.

8. The adaptive filter of claim 6, wherein said digital filter engine comprises a finite impulse response engine.

9. The adaptive filter of claim 6, wherein said coefficient update device varies said coefficient values stored in said at least two sections of said coefficient memory to minimize an error value that is determined to exist between the output of said FIR filter engine and a desired output.

10. An adaptive filter comprising:
    a data memory for storing data;
    a coefficient memory having at least two sections for storing filter coefficient mantissas in a block scale floating point format with a defined coefficient exponent value associated with each of said at least two sections and the mantissas stored therein;

a digital filter engine for receiving input data for storage in said data memory and processing said stored data and said stored coefficient mantissas to provide a digital filter output value;

a coefficient update device for varying said coefficient mantissa values stored in said data memory in accordance with a predetermined algorithm to provide updated coefficient mantissas for storage in said coefficient memory; and an exponent device for varying the exponent of the filter coefficient for a given length mantissa in each of said at least two sections to maximize the range of values that can be stored as a mantissa in said at least two sections, said exponent device including:

a comparison circuit for comparing the largest coefficient mantissa to a desired threshold value for each of the coefficient mantissas stored in each of said at least two sections in said coefficient memory;

a right shift circuit for shifting right by a predetermined number of bits the coefficient mantissa in each of said at least two sections having the largest value when the value thereof exceeds the desired threshold and incrementing the exponent for the associated one of said at least two sections by the predetermined number of bits, and a left shift circuit for shifting left by a predetermined number of bits the coefficient mantissa in each of said at least two sections having the largest value when the value thereof is less than the desired threshold and decrementing the exponent for the associated one of said at least two sections by the predetermined number of bits.

11. A method for adaptively filtering data, comprising the steps of:

storing data in a data memory;

storing filter coefficient mantissas in a coefficient memory in a block scale floating point format with a defined coefficient exponent value;

receiving input data with a digital filter engine for storage in the data memory and processing the stored data and the stored coefficient mantissas to provide a digital filter output value;

varying the coefficient mantissa values with a coefficient update device stored in the data memory in accordance with a predetermined algorithm to provide updated coefficient mantissas for storage in the coefficient memory in a given update cycle; and varying with an exponent device the exponent of the filter coefficient for a mantissa in a subsequent update cycle to maximize the range of values that can be stored as a mantissa.

12. The method of claim 11, wherein the data memory is operable to store data in a floating point format with both a mantissa and exponent associated with each data word stored.

13. The method of claim 11, wherein the digital filter engine comprises a finite impulse response engine.

14. The method of claim 11, wherein the coefficient update device varies the coefficient values stored in the coefficient memory to minimize an error value that is determined to exist between the output of the FIR filter engine and a desired output.

15. A method for adaptively filtering data, comprising the steps of:

storing data in a data memory;

storing filter coefficient mantissas in a coefficient memory in a block scale floating point format with a defined coefficient exponent value;

receiving input data with a digital filter engine for storage in the data memory and processing the stored data and the stored coefficient mantissas to provide a digital filter output value;

varying the coefficient mantissa values with a coefficient update device stored in the data memory in accordance with a predetermined algorithm to provide updated coefficient mantissas for storage in the coefficient memory;

varying with an exponent device the exponent of the filter coefficient for a mantissa to maximize the range of values that can be stored as a mantissa, the step of varying including the steps of:

comparing with a comparison circuit the largest coefficient mantissa to a desired threshold value for each of the coefficient mantissas stored in the coefficient memory, shifting right by a predetermined number of bits with a right shift circuit the coefficient mantissa having the largest value when the value thereof exceeds the desired threshold and incrementing the exponent by the predetermined number of bits, and shifting left by a predetermined number of bits with a left shift circuit the coefficient mantissa having the largest value when the value thereof is less than the desired threshold and decrementing the exponent by the predetermined number of bits.

16. A method for adaptively filtering data, comprising the steps of:

storing data in a data memory;

storing in a coefficient memory having at least two sections filter coefficient mantissas in a block scale floating point format with a defined coefficient exponent value associated with each of the at least two sections and the mantissas stored therein;

receiving input data with a digital filter engine for storage in the data memory and processing the stored data and the stored coefficient mantissas to provide a digital filter output value;

varying with a coefficient update device the coefficient mantissa values stored in the data memory in accordance with a predetermined algorithm to provide updated coefficient mantissas for storage in the coefficient memory in a given update cycle; and varying with an exponent device the exponent of the filter coefficient for a given length mantissa in a subsequent update cycle in each of the at least two sections to maximize the range of values that can be stored as a mantissa in the at least two sections.

17. The method of claim 16, wherein the data memory is operable to store data in a floating point format with both a mantissa and exponent associated with each data word stored.

18. The method of claim 16, wherein the digital filter engine comprises a finite impulse response engine.

19. The method of claim 16, wherein the coefficient update device varies the coefficient values stored in the at least two sections of the coefficient memory to minimize an error value that is determined to exist between the output of the FIR filter engine and a desired output.

20. A method for adaptively filtering data, comprising the steps of:

storing data in a data memory;

storing in a coefficient memory having at least two sections filter coefficient mantissas in a block scale floating point format with a defined coefficient exponent value associated with each of the at least two sections and the mantissas stored therein;

receiving input data with a digital filter engine for storage in the data memory and processing the stored data and the stored coefficient mantissas to provide a digital filter output value;

varying with a coefficient update device the coefficient mantissa values stored in the data memory in accordance with a predetermined algorithm to provide updated coefficient mantissas for storage in the coefficient memory;

varying with an exponent device the exponent of the filter coefficient for a given length mantissa in each of the at least two sections to maximize the range of values that can be stored as a mantissa in the at least two sections, the step of varying including the steps of:

comparing with a comparison circuit the largest coefficient mantissa to a desired threshold value for each of the coefficient mantissas stored in each of the at least two sections in the coefficient memory, shifting right by a predetermined number of bits with a right shift circuit the coefficient mantissa in each of the at least two sections having the largest value when the value thereof exceeds the desired threshold and incrementing the exponent for the associated one of the at least two sections by the predetermined number of bits, and shifting left by a predetermined number of bits with a left shift circuit the coefficient mantissa in each of the at least two sections having the largest value when the value thereof is less than the desired threshold and decrementing the exponent for the associated one of the at least two sections by the predetermined number of bits.

21. A telephony system for interfacing between a far-end user and a near-end user over a distribution line disposed between the far-end user and the near-end user, comprising:

a receive path at the near-end for receiving an inbound signal from the far-end user over a telephony line;

a first audio transducer for converting said inbound signal to an audible signal;

a second audio transducer for converting an audible signal at the near end to an outbound audio signal for transmission over the telephony line;

a transmit path for transmitting the outbound audio signal to the far-end user; and an echo canceler device disposed at the near end between the receive path and the transmit path and including an adaptive filter, said adaptive filter having:

a data memory for storing data, a coefficient memory for storing filter coefficient mantissas in a block scale floating point format with a defined coefficient exponent value, a digital filter engine for receiving input data for storage in said data memory and processing said stored data and said stored coefficient mantissas to provide a digital filter output value, a coefficient update device for varying said coefficient mantissa values stored in said data memory in accordance with a predetermined algorithm to provide updated coefficient mantissas for storage in said coefficient memory in a given update cycle, and an exponent device for varying the exponent of the filter coefficient for a mantissa in a subsequent update cycle to maximize the range of values that can be stored as a mantissa.

22. The system of claim 21, wherein said data memory is operable to store data in a floating point format with both a mantissa and exponent associated with each data word stored.

23. The system of claim 21, wherein said digital filter engine comprises a finite impulse response engine.

24. The system of claim 21, wherein said coefficient update device varies said coefficient values stored in said coefficient memory to minimize an error value that is determined to exist between the output of said FIR filter engine and a desired output.

25. A telephony system for interfacing between a far-end user and a near-end user over a distribution line disposed between the far-end user and the near-end user, comprising:

a receive path at the near-end for receiving an inbound signal from the far-end user over a telephony line;

a first audio transducer for converting said inbound signal to an audible signal;

a second audio transducer for converting an audible signal at the near end to an outbound audio signal for transmission over the telephony line;

a transmit path for transmitting the outbound audio signal to the far-end user; and an echo canceler device disposed at the near end between the receive path and the transmit path and including an adaptive filter, said adaptive filter having:

a data memory for storing data, a coefficient memory for storing filter coefficient mantissas in a block scale floating point format with a defined coefficient exponent value, a digital filter engine for receiving input data for storage in said data memory and processing said stored data and said stored coefficient mantissas to provide a digital filter output value, a coefficient update device for varying said coefficient mantissa values stored in said data memory in accordance with a predetermined algorithm to provide updated coefficient mantissas for storage in said coefficient memory, and an exponent device for varying the exponent of the filter coefficient for a mantissa to maximize the range of values that can be stored as a mantissa, said exponent device including:

a comparison circuit for comparing the largest coefficient mantissa to a desired threshold value for each of the coefficient mantissas stored in said coefficient memory, a right shift circuit for shifting right by a predetermined number of bits the coefficient mantissa having the largest value when the value thereof exceeds the desired threshold and incrementing the exponent by the predetermined number of bits, and a left shift circuit for shifting left by a predetermined number of bits the coefficient mantissa having the largest value when the value thereof is less than the desired threshold and decrementing the exponent by the predetermined number of bits.

26. A speakerphone system, comprising:

a receive path for receiving an inbound signal from a far-end user over a subscriber line;

a first audio transducer for converting said inbound signal to an audible signal;

a second audio transducer for converting an audible signal proximate said first audio transducer to an outbound audio signal for transmission over the subscriber line;

a transmit path for transmitting the outbound audio signal to the far-end user; and an echo canceler device disposed between the receive path and the transmit path and including an adaptive filter, said adaptive filter having:
  a data memory for storing data,
  a coefficient memory for storing filter coefficient mantissas in a block scale floating point format with a defined coefficient exponent value,
  a digital filter engine for receiving input data for storage in said data memory and processing said stored data and said stored coefficient mantissas to provide a digital filter output value,
  a coefficient update device for varying said coefficient mantissa values stored in said data memory in accordance with a predetermined algorithm to provide updated coefficient mantissas for storage in said coefficient memory in a given update cycle, and
  an exponent device for varying the exponent of the filter coefficient in a subsequent update cycle for a mantissa to maximize the range of values that can be stored as a mantissa.

27. The speakerphone system of claim 26, wherein said data memory is operable to store data in a floating point format with both a mantissa and exponent associated with each data word stored.

28. The speakerphone system of claim 26, wherein said digital filter engine comprises a finite impulse response engine.

29. The speakerphone system of claim 26, wherein said coefficient update device varies said coefficient values stored in said coefficient memory to minimize an error value that is determined to exist between the output of said FIR filter engine and a desired output.

30. A speakerphone system comprising:
  a receive path for receiving an inbound signal from a far-end user over a subscriber line;
  a first audio transducer for converting said inbound signal to an audible signal;
  a second audio transducer for converting an audible signal proximate said first audio transducer to an outbound audio signal for transmission over the subscriber line;
  a transmit path for transmitting the outbound audio signal to the far-end user; and
  an echo canceler device disposed between the receive path and the transmit path and including an adaptive filter, said adaptive filter having:
    a data memory for storing data,
    a coefficient memory for storing filter coefficient mantissas in a block scale floating point format with a defined coefficient exponent value,
    a digital filter engine for receiving input data for storage in said data memory and processing said stored data and said stored coefficient mantissas to provide a digital filter output value,
    a coefficient update device for varying said coefficient mantissa values stored in said data memory in accordance with a predetermined algorithm to provide updated coefficient mantissas for storage in said coefficient memory, and
    an exponent device for varying the exponent of the filter coefficient for a mantissa to maximize the range of values that can be stored as a mantissa said exponent device including:
      a comparison circuit for comparing the largest coefficient mantissa to a desired threshold value for each of the coefficient mantissas stored in said coefficient memory,
      a right shift circuit for shifting right by a predetermined number of bits the coefficient mantissa having the largest value when the value thereof exceeds the desired threshold and incrementing the exponent by the predetermined number of bits, and
      a left shift circuit for shifting left by a predetermined number of bits the coefficient mantissa having the largest value when the value thereof is less than the desired threshold and decrementing the exponent by the predetermined number of bits.

31. An echo canceler device disposed between the receive path and the transmit path in a telephony system and including an adaptive filter, said adaptive filter having:
  a data memory for storing data;
  a coefficient memory for storing filter coefficient mantissas in a block scale floating point format with a defined coefficient exponent value;
  a digital filter engine for receiving input data for storage in said data memory and processing said stored data and said stored coefficient mantissas to provide a digital filter output value;
  a coefficient update device for varying said coefficient mantissa values stored in said data memory in accordance with a predetermined algorithm to provide updated coefficient mantissas for storage in said coefficient memory in a given update cycle; and
  an exponent device for varying the exponent of the filter coefficient in a subsequent update cycle for a mantissa to maximize the range of values that can be stored as a mantissa.

* * * * *